(12) United States Patent
Dempsey et al.

(10) Patent No.: US 10,094,860 B2
(45) Date of Patent: Oct. 9, 2018

(54) SYSTEM AND METHOD FOR ESTIMATING ENERGY CONSUMPTION OF AN HVAC SYSTEM

(71) Applicant: Carrier Corporation, Farmington, CT (US)

(72) Inventors: Daniel J. Dempsey, Carmel, IN (US); Rajendra K. Shah, Indianapolis, IN (US)

(73) Assignee: CARRIER CORPORATION, Farmington, CT (US)

(*) Notice: Subject to any disclaimer, the term of this patent is extended or adjusted under 35 U.S.C. 154(b) by 240 days.

(21) Appl. No.: 15/070,897

(22) Filed: Mar. 15, 2016

(65) Prior Publication Data
US 2016/0290670 A1  Oct. 6, 2016

Related U.S. Application Data

(60) Provisional application No. 62/140,097, filed on Mar. 30, 2015.

(51) Int. Cl.
| G05D 23/00 | (2006.01) |
| G05B 13/00 | (2006.01) |
| F25D 23/12 | (2006.01) |
| G01R 22/06 | (2006.01) |
| G01R 22/10 | (2006.01) |
| F24F 11/47 | (2018.01) |

(52) U.S. Cl.
CPC ........... *G01R 22/061* (2013.01); *G01R 22/10* (2013.01); *F24F 11/47* (2018.01)

(58) Field of Classification Search
CPC .................................. F24F 11/0086

USPC ......................................................... 700/276
See application file for complete search history.

(56) References Cited

U.S. PATENT DOCUMENTS

| 5,533,356 A | * | 7/1996 | DeMasters | ............... E21B 23/01 |
| | | | | 165/45 |
| 5,671,608 A | * | 9/1997 | Wiggs | ........................ F24J 3/08 |
| | | | | 165/45 |
| 5,758,514 A | * | 6/1998 | Genung | ................... F24J 3/086 |
| | | | | 62/324.4 |

(Continued)

FOREIGN PATENT DOCUMENTS

| CN | 201443933 U | 4/2010 |
| DE | 102008039105 A1 | 2/2010 |

(Continued)

OTHER PUBLICATIONS

Unknown, GxTrackerTM, Ground Energy Support.

(Continued)

*Primary Examiner* — Suresh Suryawanshi
(74) *Attorney, Agent, or Firm* — Cantor Colburn LLP

(57) ABSTRACT

A system and method for estimating energy consumption in an HVAC system, the method including the steps of determining a system characteristic value, obtaining an operational condition value, determining a base power consumption value based at least in part on the system characteristic value and the operational condition value, determining an operational run time for the system, and determining an estimated energy consumption based at least in part on the operational run time and the base power consumption value.

15 Claims, 3 Drawing Sheets

(56) References Cited

U.S. PATENT DOCUMENTS

| | | | |
|---|---|---|---|
| 2011/0220317 A1* | 9/2011 | Kidwell | F24J 3/083 165/11.1 |
| 2011/0272117 A1 | 11/2011 | Linn et al. | |
| 2012/0310416 A1* | 12/2012 | Tepper | G05B 15/00 700/276 |
| 2013/0179373 A1* | 7/2013 | Mutchnik | G06Q 30/0283 705/412 |
| 2014/0074542 A1* | 3/2014 | Edens | G06Q 10/06315 705/7.25 |
| 2014/0133519 A1 | 5/2014 | Freitag | |
| 2014/0163746 A1* | 6/2014 | Drew | F24F 11/0086 700/276 |
| 2014/0316586 A1* | 10/2014 | Boesveld | H04Q 9/00 700/278 |

FOREIGN PATENT DOCUMENTS

| | | |
|---|---|---|
| DE | 102012002028 A1 | 8/2013 |
| EP | 2058607 A2 | 5/2009 |
| WO | 2012061929 A1 | 5/2012 |

OTHER PUBLICATIONS

Geo-Connections Inc., We Design Geothermal Software.
Powerhouse Dynamics, Inc., SiteSage.
Evan Lubofsky, DA & Control Monitoring Geothermal Heat Pumps, Sensors, 2010.
geojerry.com, How to Calculate the COP and EER of a Geothermal Heat Pump.
Matt Davis, Performance Monitoring—COPs, Ground Energy Support, Jun. 13, 2013.
ClimateMaster "Geothermal Heat Pump Systems" available at: http://www.climatemaster.com/residential/geothermal-heat-pumps/, accessed Mar. 12, 2018, 3pgs.
My E-Wise—Geothermal Installation Guide; OSMS Geothermal Installation Manual V1.02; EnergyWise Partners LLC; 2012; 11 pages.
Shonder et al.; "Selecting the Design Entering Water Tempature for Vertical Geothermal Heat Pumps in Cooling-Dominated Applications"; ASHRAE 2001 Annual Meeting; Cincinnati, OH; Jun. 23-27, 2001; 16 pages.

* cited by examiner

SYSTEM AND METHOD FOR ESTIMATING ENERGY CONSUMPTION OF AN HVAC SYSTEM

CROSS REFERENCE TO RELATED APPLICATIONS

The present application is related to, and claims the priority benefit of, U.S. Provisional Patent Application Ser. No. 62/140,097 filed Mar. 30, 2015, the contents of which are hereby incorporated in their entirety into the present disclosure.

TECHNICAL FIELD OF THE DISCLOSED EMBODIMENTS

The presently disclosed embodiments are generally related to heating, ventilation, and air conditioning ("HVAC") systems; and more particularly to a system and method for estimating energy consumption of an HVAC system.

BACKGROUND OF THE DISCLOSED EMBODIMENTS

Generally, home energy management systems utilize operational run time of HVAC units as a surrogate for energy usage. However, for many HVAC system applications, the use of only operational run time typically does not provide the most accurate account of the energy consumed, as other factors are unique to such a system. In some instances, the systems utilize ratings information of the individual HVAC components in the computation of energy usage. However, the ratings information are generally energy consumption estimates for a "typical" weather season, in a "typical" home, with "typical" user settings and internal loads, and "typical" weather conditions.

Accordingly, there exists a need for a system and method to more accurately estimate the energy consumption for an HVAC system.

SUMMARY OF THE DISCLOSED EMBODIMENTS

In one aspect, an HVAC system is provided. The HVAC system includes at least one HVAC component including at least one component characteristic. The HVAC system further includes a controller in communication with the at least one HVAC component. In an embodiment, the controller includes a communication device.

In an embodiment, the HVAC system further includes a sensor operably coupled to the at least one HVAC component. The sensor is configured to measure an operational condition value. In an embodiment, the operation condition value includes at least one of an outdoor air temperature value and an incoming heat exchange temperature fluid value.

In one aspect, a method of determining the energy consumption of the HVAC system is provided. The method includes the step of determining a system characteristic value. In an embodiment, the system characteristic value is based at least in part on at least one component characteristic value. In another embodiment, the system characteristic value may be determined by accessing a secondary source.

The method includes the step of obtaining an operational condition value. In one embodiment, the operational condition value includes at least one of an incoming heat exchange fluid temperature, an outdoor air temperature value, and a soil temperature value. In an embodiment, the operational condition value is obtained by operating the sensor to measure the operational condition value. In an alternative embodiment, the operational condition value is obtained by accessing a secondary source. In one embodiment, the incoming heat exchange fluid temperature value is obtained by determining a correlation between an outdoor air temperature value and/or a soil temperature value.

The method further includes the step of determining a base power consumption value based at least in part on the system characteristic value and the operational condition value. In an embodiment, determining a base power consumption value further includes selecting an installation configuration from a group consisting of: horizontal loop and vertical loop. In an embodiment, the communication device retrieves the data comprising a mean hourly soil temperature at a specific depth and uses that data as a surrogate for the incoming heat exchange fluid temperature value. In an embodiment, the communication device may obtain the soil temperature at any desired interval or continuously. In an embodiment, the communication device may obtain the soil temperature at any desired depth or at a plurality of desired depth.

The method further includes the step of determining an operational run time for the system. The method further includes the step of determining an estimated energy consumption based at least in part on the operational run time and the base power consumption value.

The method further includes the step of displaying the estimated energy consumption. In an embodiment, the estimated energy consumption may be displayed on the controller. In an alternate embodiment, the estimated energy consumption may be transmitted from the controller via the communication device to an external device.

DETAILED DESCRIPTION OF THE DISCLOSED EMBODIMENTS

Figure 1:
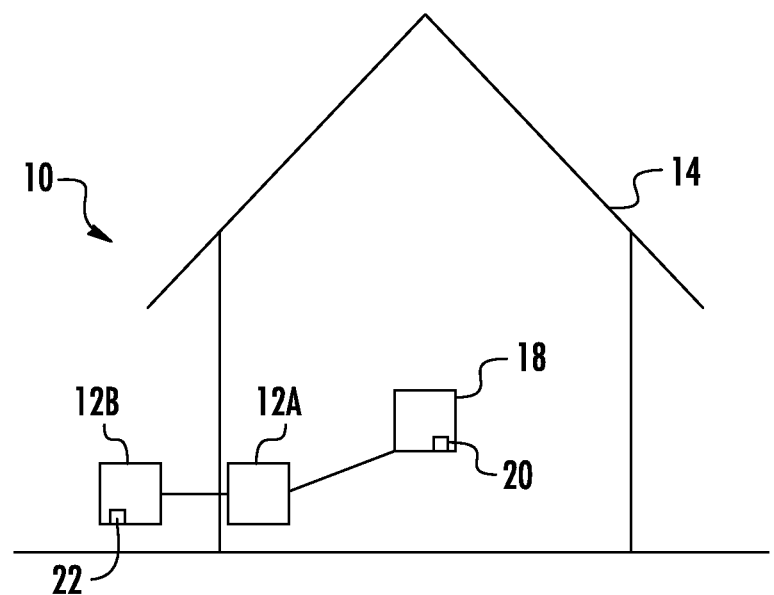
FIG. 1 illustrates a schematic diagram of an HVAC system according to an embodiment of the present disclosure.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

FIG. 1 illustrates an embodiment of an HVAC system, generally indicated at 10. The HVAC system 10 is an embodiment of an air-sourced HVAC system that includes at least one HVAC component 12 including at least one component characteristic. The HVAC system 10 is configured to heat and cool a building 14. For example, the at least one HVAC component may include a furnace, air handler, air conditioner, heat pump, and geothermal heat pump to name a few non-limiting examples. Each HVAC component includes at least one component characteristic, such as efficiency ratings, heating capacities, and cooling capacities to name a few non-limiting examples. In the example shown in FIG. 1, the HVAC system 10 includes a two-stage gas furnace 12A in communication with a two stage air conditioner 12B.

The HVAC system 10 further includes a controller 18 in communication with the at least one HVAC component 12. It will be appreciated that the controller 18 may be in wired or wireless communication to the at least one HVAC component 12. The controller 18, such as a thermostat, to name one non-limiting example, is configured to determine an estimated energy consumption of the HVAC system 10, and send operating commands to the at least one HVAC component 12 to operate in a heating or cooling mode. It will be appreciated that the controller 18 may be internal or external to the at least one HVAC component 12. For example, the controller 18 may be a control board within the at least one HVAC component 12, or the controller may be a thermostat, external to the at least one HVAC component 12, to name a couple of non-limiting examples. In an embodiment, the controller 18 includes a communication device 20. The communication device 20 is configured to communication with an external secondary source. It will be appreciated that the communication device 20 may include any type of communication device that transmits and receives signals over one or more communication systems, such as Wi-Fi, Bluetooth, CDMA, GSM, Local Area Network (LAN), NFC, Bluetooth Low Energy signal, Z-WAVE®, DASH7™, or ZIGBEE®, to name a few non-limiting examples.

In an embodiment, the HVAC system 10 includes a sensor 22 operably coupled to the at least one HVAC component 12. The sensor 22 is configured to measure an operational condition value. In an embodiment, the operation condition value includes an outdoor air temperature value.

Figure 2:
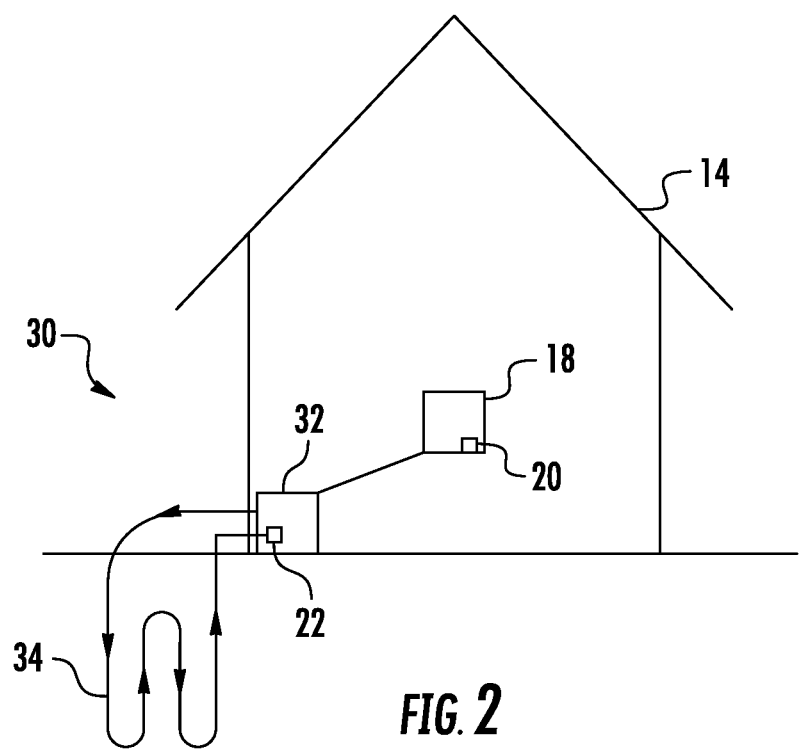
FIG. 2 illustrates a schematic diagram of a geothermal heat pump system according to another embodiment of the present disclosure.

In the embodiment shown in FIG. 2, the HVAC system 10 comprises a geothermal heat pump system 30. Generally, geothermal heat pump systems 30 utilize the relatively constant temperature of the earth below the ground surface as a heat sink in an air conditioning system and heat source in a heat pumping system, in which to efficiently cool or heat a building 14. Conventional geothermal heat pump systems 30 comprise a heat exchange unit 32, including an inlet and an outlet that is in fluid communication with a loop of tubing 34 buried in the ground, commonly referred to as a ground loop.

In this embodiment, the sensor 22 is configured to measure the temperature of a heat-exchange fluid as it enters the inlet of the heat exchange unit 32. The heat-exchange fluid, such as a water/ethylene glycol mixture, is circulated through the ground loop 34, during which heat is exchanged between the earth proximate the ground loop 34 and the heat exchange fluid. When the heat exchange fluid returns to the heat exchange unit 32 after having circulated through the ground loop, the temperature difference between the heat exchange fluid being fed to the ground loop 34 and the heat exchange fluid returning from the ground loop 34 is used by the heat exchange unit 32 to generate either heated or cooled air. This heated or cooled air is then circulated into the interior of a building 14 to control its internal climate.

A variety of ground loop 34 configurations can be used with geothermal heat pump systems 30. For example, "closed-loop" configurations, in which the ground loop 34 provides a closed circuit for the circulating heat exchange fluid, two known configurations are commonly employed, namely horizontal closed-loop and vertical closed-loop configurations. In the horizontal closed-loop configuration, the ground loop 34 is typically laid horizontally in a shallow trench dug into the ground adjacent the building 14 to be serviced by the geothermal heat pump system. In the vertical closed-loop configuration, as shown in FIG. 2, the ground loop is typically placed in a 100 foot to 400 foot deep well formed in ground adjacent the building 14 to be serviced by the geothermal heat pump system 30. It will be appreciated that the present disclosure is also applicable for open loop systems which utilize well, lake or pond water.

Figure 3:
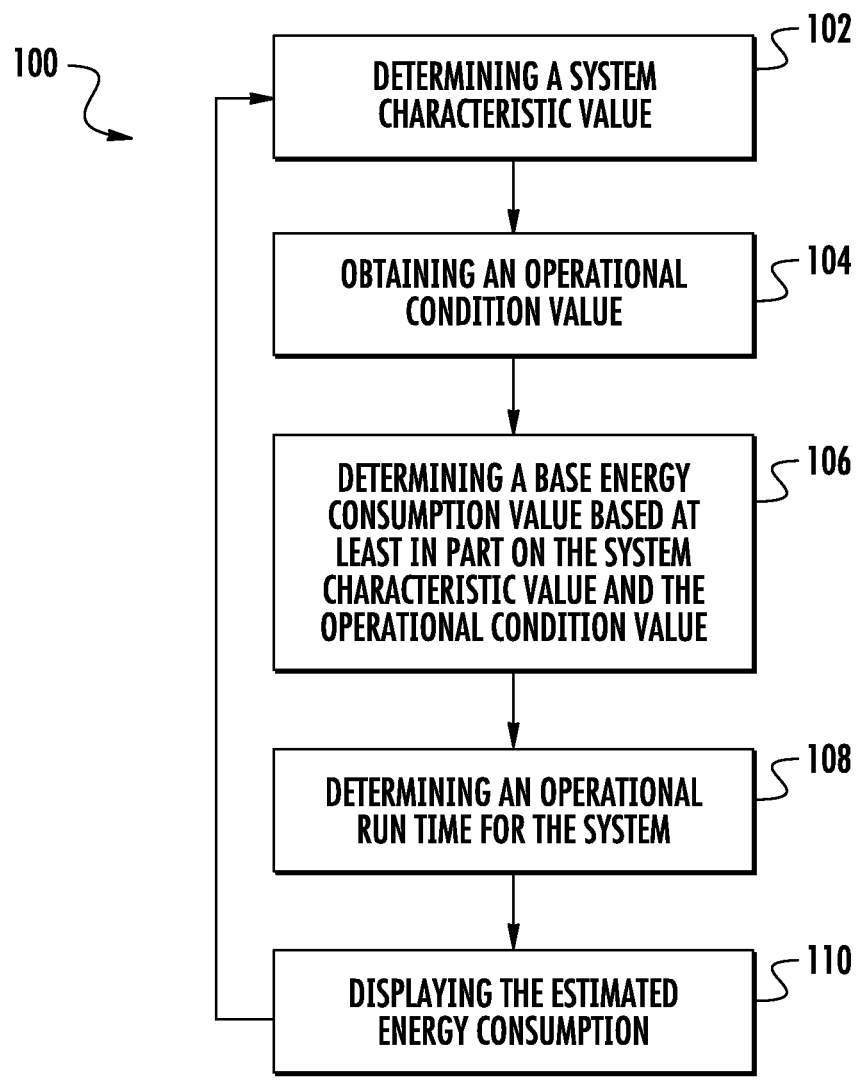
FIG. 3 illustrates a schematic flow diagram of a method for estimating energy consumption in an HVAC system according to at least one embodiment of the present disclosure.
Figure 4:
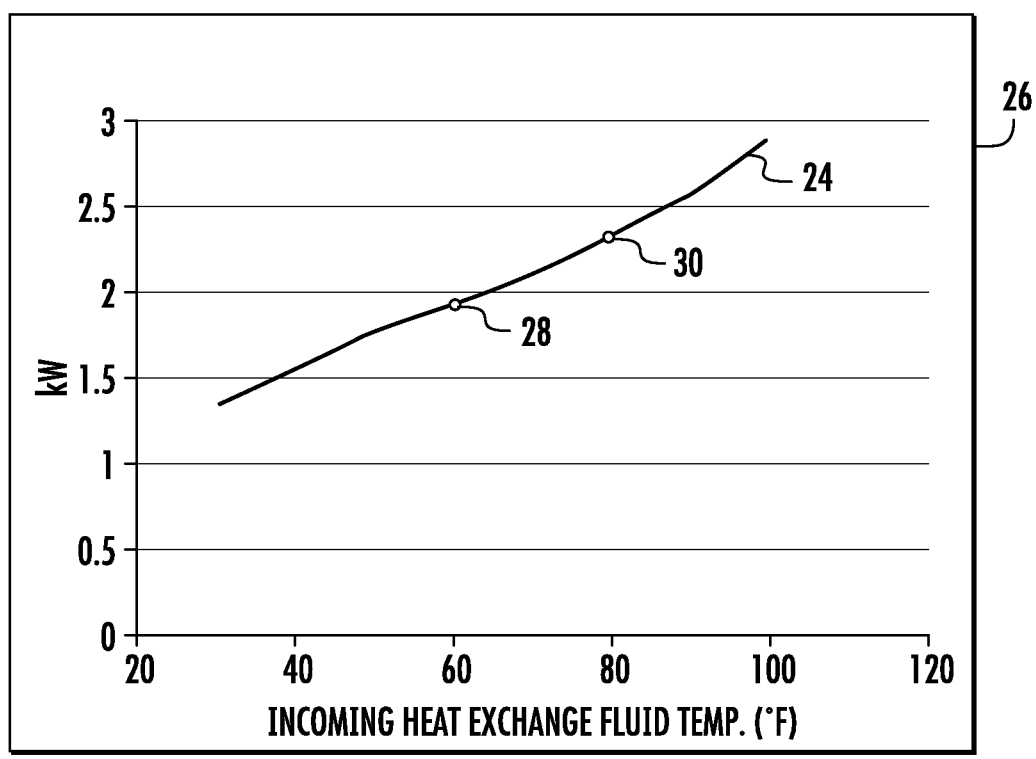
FIG. 4 illustrates a graph of kilowatts consumed in relation to incoming heat exchange fluid temperature according to an embodiment of the present disclosure.

FIG. 3 illustrates a method of determining the energy consumption of the HVAC system 10 and the geothermal heat pump system 30, the method generally indicated at 100. The method includes step 102 of determining a system characteristic value. In an embodiment, the system characteristic value is based at least in part on at least one component characteristic value. In another embodiment, the system characteristic value may be determined by accessing a secondary source. It will be appreciated that the user may manually register the HVAC system 10 or the geothermal heat pump system 30 or each system may automatically register each of the components therein at an internet website or similar network interface. The registration may be linked to a database containing each of the component characteristic values, and determine a system characteristic value based on the registered components of the system. It will further be appreciated that the user may register the components within the system via any suitable device, such as a mobile device, laptop computer, desk top computer, etc. to name a few non-limiting examples.

The method 100 includes step 104 of obtaining an operational condition value. In one embodiment, the operational condition value includes at least one of an incoming heat exchange fluid temperature, an outdoor air temperature value, and a soil temperature value. In an embodiment, the operational condition value is obtained by operating the sensor 22 to measure the operational condition value. In an alternative embodiment, the operational condition value is obtained by accessing a secondary source. In an embodiment for a geothermal heat pump system 30, the incoming heat exchange fluid temperature value is obtained by determining a correlation between an outdoor air temperature value and/or a soil temperature value. It will be appreciated that other operational condition values, such as a circulating airflow value, a return air sensible temperature value, and return air wet bulb temperature value may be used, to name a few non-limiting examples.

The method 100 further includes step 106 of determining a base power consumption value based at least in part on the system characteristic value and the operational condition value. Initially, the base power consumption value may be established experimentally based at least in part on the system characteristic value and the operational condition value and a correlation established between the base energy value, on the one hand, and the system characteristic value and the operational condition value on the other hand. Subsequently, the base power consumption value may be determined using the established correlation between the system characteristic value and operational condition value, and the base energy value.

In an embodiment for a geothermal heat pump system 30, determining a base power consumption value further includes selecting an installation configuration from a group consisting of: horizontal loop and vertical loop. In this embodiment, the incoming heat exchange fluid temperature value is obtained by accessing a secondary source to obtain a soil temperature, wherein the soil temperature is based at least in part on the installation configuration and the geographic location of the geothermal heat pump system 30. In an embodiment, the communication device 20 may obtain the soil temperature at any desired interval or continuously. In one embodiment, the communication device 20 may obtain the soil temperature at any desired depth or at a plurality of desired depths.

The method 100 further includes step 108 of determining an operational run time for the HVAC system 10 or geothermal heat pump system 30. The method 100 further includes step 110 of determining an estimated energy consumption based at least in part on the operational run time and the base power consumption value. The method 100 further includes step 112 of displaying the estimated energy consumption. In an embodiment, the estimated energy consumption may be displayed on the controller 18. In an alternate embodiment, the estimated energy consumption may be transmitted from the controller 18 via the communication device 20 to an external device, such as a smartphone, laptop computer, desktop computer, remote server, etc. to name a few non-limiting examples.

In an example to estimate the energy consumption of the HVAC system 10, each of the at least one HVAC components 12 associated with the system 10 are tested to determine an overall system characteristic value based on the individual component characteristics (i.e. seasonal efficiency, capacity, compressor type, fan motor types, fuel input rates, operating stages, etc. to name a few non-limiting examples). The individual component characteristics are generally generated by manufacturers during the development of the components 12. The system characteristic value for the HVAC system 10 may then be placed in a computational model to determine the system characteristic value for a combination of components 12 over a range of similar HVAC system 10. In other embodiments, the system characteristic value may be obtained by downloading the value from a remote server database containing a complete set of characteristic for each equipment combination that may be installed at a building 14, to name one non-limiting example.

The sensor 22 placed on the two-stage air conditioner 12B may obtain the outdoor air temperature based on where the two-stage air conditioner 12B is located. The measured outdoor air temperature value is transmitted to the controller 18. Alternatively, the communication device 20 may obtain the outdoor air temperature from the internet, a publicly available database or weather service, or any other source to name a few non-limiting example. The controller 18 operates to determine the base power consumption value (e.g. kilowatts) consumed using the established relationship based upon the outdoor air temperature value where the HVAC system 10 is located and the system characteristic value. Therefore, the controller 18 may determine that the HVAC system 10 operating in a single stage cooling mode with an outdoor temperature value of 85 degrees Fahrenheit consumes 3.4 kilowatts of power, based upon the previous experimentally established relationship. It will be appreciated that the base power consumption value may be cumulated over any period of time. It will also be appreciated that additional component characteristic values may be included in the methodology to determine the base power consumption value.

To obtain the operational run time of the HVAC system 10, the controller 18 monitors and stores the amount of time in which the HVAC system 10 operates the motor, and/or compressor to circulate the heated or cooled air into the interior of a building 14 to control the internal climate. Once the controller 18 has determined the base power consumption value, the controller 18 multiplies the base power consumption value by the operational run time of the HVAC system 10. Thus, if the outdoor temperature value of 85 degrees Fahrenheit (approximately 29.4 degrees Celsius) and the operational run time, in cooling mode, is approximately 2 hours, the estimated energy consumption would equal 6.8 (2×3.4) kilowatts-hours to cool the interior of the building 14.

In the example shown in FIG. 2, to estimate the energy consumption of the geothermal heat pump system 30, it will be appreciated that the system characteristic value may be the same as the component characteristic value in instances where the at least one HVAC component 12 is a packaged unit, for example the heat exchange unit 32. It will further be appreciated that estimating the energy consumption in a split geothermal heat pump system may be a combination of the methodology as described herein.

As the heat exchange fluid circulates through the ground loop 34 and returns to the heat exchange unit 32, the incoming temperature of the heat exchange fluid is measured by the sensor 22 as it enters the heat exchange unit 32, and the sensor 22 transmits the temperature values to the controller 18. Alternatively, based on whether the loop of tubing 34 is in a horizontal or vertical configuration, the communication module 20 may access soil temperature data, at various depths, from a secondary source, such as the United States Department of Agriculture's Natural Resources Conservation Service to name one non-limiting example. Soil temperatures fluctuate on a daily, monthly, and annually basis as a function of variations in air temperature and solar radiation. The incoming heat exchange fluid temperature value may be estimated using a sinusoidal function with a phase angle shift between the outdoor air temperature and the outdoor ground temperature. In just one example, the incoming heat exchange fluid temperature for a given location may be estimated with the following sinusoidal function:

$$EHEFT = AVG(OAT) - MA + $$
$$\frac{1}{2}((MAX(OAT) - SA) - (MIN(OAT) - WA)) \times \sin\left(\frac{60\pi(OML5)}{360}\right)$$
$$MA = K1(OAT) + K2$$

Where EHEFT is the incoming heat exchange fluid temperature value, AVG(OAT) is the average monthly outdoor air temperature for the prior 12 months lagged by 1 month, MA is the mean average used to calibrate the mean and amplitude of the monthly outdoor air temperature for the prior 12 months, lagged by 1 month. It will be appreciated that K1 and K2 may be any desired values to calibrate the mean and amplitude of the monthly outdoor air temperature for the prior 12 months. MAX(OAT) is the maximum monthly outdoor air temperature for the prior 12 months lagged by 1 month, SA is a summer adjustment temperature for a given location (e.g. a summer adjustment temperature in Virginia may be 1° F.), MIN(OAT) is the minimum monthly outdoor air temperature for the prior 12 months lagged by 1 month, WA is a winter adjustment temperature for a given location (e.g. a winter adjustment temperature in Virginia may be 1° F.). It will be appreciated that the summer and winter adjustment temperatures may be adjusted based on the geographic location of the heat exchange unit 32.

OML5 is the monthly average outdoor air temperature for the prior 12 months lagged by 5 months. The above equations are only exemplary and one of skill in the art would recognize that any of a variety of equations may be used to relate the outdoor air temperature to the outdoor ground temperature.

The controller 18 operates to determine the base power consumption value (e.g. kilowatts) consumed based on the incoming heat exchange fluid temperature value. As shown, the curve 24 of graph 26 shows the incoming heat exchange fluid temperature values along the x axis and kilowatts consumed (in cooling mode) along the y axis. An incoming heat exchange fluid temperature value of approximately 60 degrees Fahrenheit (approximately 15.6 degrees Celsius) is estimated to consume approximately 1.8 kilowatts at point 28, and an incoming heat exchange fluid temperature value of approximately 80 degrees Fahrenheit (approximately 26.7 degrees Celsius) is estimated to consume approximately 2.3 kilowatts at point 30. It will be appreciated that the curve 24 is dependent upon the capacity of heat exchange unit 32, and may vary based upon said capacity. Likewise, it should be appreciated that other factors, such as the particular make and model of the installed equipment will impact the relationship between incoming heat exchange fluid temperature value, run time, and energy consumed. It will also be appreciated that the curve 24 is determined empirically for a particular heat exchanger unit 32 by monitoring its actual power consumption, and the curve 24 may change based on whether the heat exchange unit 12 is operating in a heating mode or cooling mode.

Alternatively, a user may select the installation configurations and geographic location of the system 30. Based on whether the loop of tubing 34 is in a horizontal or vertical configuration, the communication module 20 may access soil temperature data, at various depths, from a secondary source, such as the United States Department of Agriculture's Natural Resources Conservation Service to name one non-limiting example. It will be appreciated that the controller 18 may determine the installation configuration and/or geographic location from a memory, external server, or secondary source to name a few non-limiting examples.

To obtain the operational run time of the geothermal heat pump system 30, the controller 18 monitors and stores the amount of time in which the geothermal heat pump system 30 operates the motor, and/or compressor to circulate the heated or cooled air into the interior of a building 14 to control the internal climate. Once the controller 18 has determined the base power consumption value, the controller 18 multiplies the base power consumption value by the operational run time of the HVAC system 10. Thus, if the incoming exchange fluid temperature value is 60 degrees Fahrenheit (approximately 15.6 degrees Celsius) and the operational run time, in cooling mode, is approximately 2 hours, the estimated energy consumption would equal 3.6 (2×1.8) kilowatts-hours to cool the interior of the building 14.

It will therefore be appreciated that the present embodiments include a controller 18 to generate a more accurate estimate of, and display of, the energy consumption of an HVAC system 10 or geothermal heat pump system 30 based on a determined system characteristic value and an operational condition value. While the invention has been illustrated and described in detail in the drawings and foregoing description, the same is to be considered as illustrative and not restrictive in character, it being understood that only certain embodiments have been shown and described and that all changes and modifications that come within the spirit of the invention are desired to be protected.

What is claimed is:

1. A method for determining energy consumption in an HVAC system, the HVAC system comprising at least one HVAC component and a controller in electrical communication with the at least one HVAC component, the at least one HVAC component including at least one component characteristic, the method comprising:
   (a) determining, by the controller, a system characteristic value;
   (b) obtaining, by the controller, operational condition values, wherein the operational condition values comprise an incoming heat exchange fluid temperature value, an outdoor air temperature value, and a soil temperature value, wherein the incoming heat exchange fluid temperature value is obtained by estimating the incoming heat exchange fluid temperature value by the controller, wherein the incoming heat exchange fluid temperature value is estimated by applying a sinusoidal function having a phase angle shift between the outdoor air temperature and the soil temperature;
   (c) determining, by the controller, a base power consumption value based at least in part on the system characteristic value and the operational condition values;
   (d) determining, by the controller, an operational run time for the HVAC system;
   (e) determining, by the controller, an estimated energy consumption based at least in part on the operational run time and the base power consumption value; and
   (f) sending, by the controller, operating commands to the at least one HVAC component to cause the at least one HVAC component to operate in a selected heating or cooling mode, wherein the mode is selected by the controller based at least in part on the estimated energy consumption.

2. The method of claim 1, further comprising:
   (g) displaying the estimated energy consumption.

3. The method of claim 1, wherein step (a) comprises accessing a secondary source to obtain the system characteristic value.

4. The method of claim 1, wherein the system characteristic value is based at least in part on at least one component characteristic value.

5. The method of claim 1, wherein step (b) comprises operating a sensor to measure at least one of the outdoor air temperature value and the soil temperature value.

6. The method of claim 1, wherein step (b) comprises accessing a secondary source over the internet to obtain at least one of the outdoor air temperature value and the soil temperature value.

7. The method of claim 6, wherein step (c) further comprises selecting an installation configuration from a group consisting of: horizontal loop and vertical loop.

8. The method of claim 7, wherein the soil temperature is obtained from the secondary source based at least in part on the installation configuration and a geographic location of the system.

9. The method of claim 6, wherein the outdoor temperature value obtained from the secondary source is based at least in part on a geographic location of the HVAC system.

10. An HVAC system comprising:
    at least one HVAC component including at least one component characteristic;
    a controller in electrical communication with the at least one HVAC component;

wherein the controller is configured to:
(a) determine a system characteristic value based at least in part on the at least one component characteristic of the at least one HVAC component;
(b) obtain operational condition values, wherein the operational condition values comprise an incoming heat exchange fluid temperature value, an outdoor air temperature value, and a soil temperature value, wherein the incoming heat exchange fluid temperature value is obtained by estimating the incoming heat exchange fluid temperature value by the controller, wherein the incoming heat exchange fluid temperature value is estimated by applying a sinusoidal function having a phase angle shift between the outdoor air temperature and the soil temperature;
(c) determine a base power consumption value based at least in part on the system characteristic value and the operational condition value;
(d) determine an operational run time for the HVAC system;
(e) determine an estimated energy consumption based at least in part on the operational run time and the base power consumption value; and
(f) send operating commands to the at least one HVAC component to cause the at least one HVAC component to operate in a selected heating or cooling mode, wherein the mode is selected by the controller based at least in part on the estimated energy consumption.

11. The system of claim 10, wherein the controller is further configured to display the estimated energy consumption.

12. The system of claim 10, wherein the system further comprises a sensor in communication with the controller, the sensor configured to measure at least one of the outdoor air temperature value and the soil temperature value.

13. The system of claim 10, wherein the controller further includes a communication device, the communication device is configured to exchange information with a secondary source over the internet to obtain at least one of the outdoor air temperature value and the soil temperature value.

14. The system of claim 10, wherein the controller is further configured to transmit the estimated energy consumption to an external device.

15. The system of claim 10, wherein the system characteristic value is stored at a secondary source.

* * * * *